May 7, 1968 J. R. DAVIS 3,382,462
FREQUENCY MODULATED CRYSTAL OSCILLATOR
Filed May 24, 1966
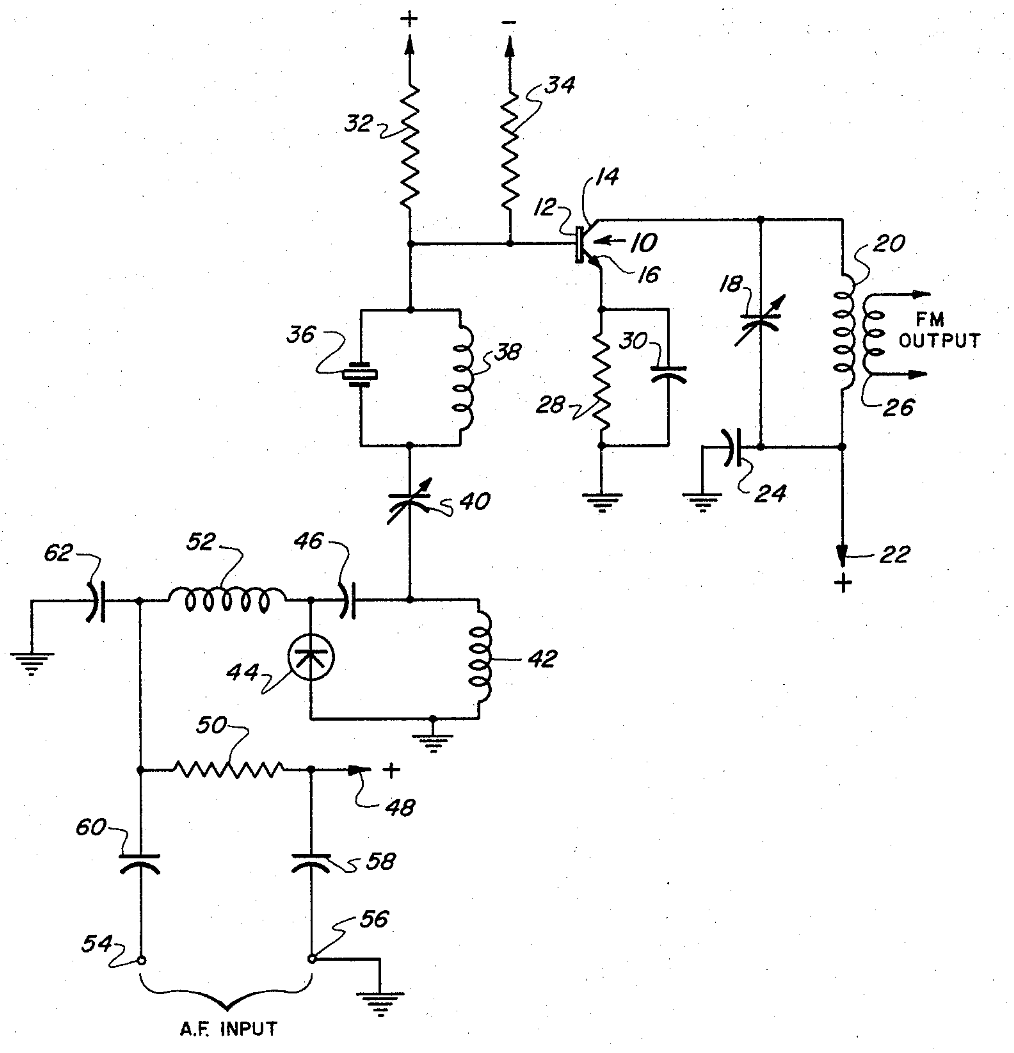
JAMES R. DAVIS
INVENTOR
BY
BUCKHORN, BLORE, KLARQUIST & SPARKMAN
ATTORNEYS United States Patent Office 3,382,462
Patented May 7, 1968

3,382,462
FREQUENCY MODULATED CRYSTAL OSCILLATOR
James R. Davis, 3038 SE. Morrison, Portland, Oreg. 97214
Filed May 24, 1966, Ser. No. 552,506
5 Claims. (Cl. 332—26)

This invention relates to a frequency modulated crystal oscillator and particularly to a frequency modulated crystal oscillator of economical construction avoiding complex intercircuit feedback loops, transformers, and the like.

Although the usual piezoelectric crystal oscillator is quite stable in its operation and may be used as a standard for producing a single frequency output, it has nonetheless been found possible to frequency modulate such an oscillator. By changing the phase relationships in the crystal oscillator by means of a modulating input frequency, the oscillator may be made to vary in frequency about the nominal resonant frequency of the crystal. Prior oscillators of this type have been somewhat complicated, sometimes employing a plurality of stages with feedback coupling circuits therebetween for achieving oscillation while varying the frequency of such oscillation with audio information. Also, since the impedance of the crystal tends to change somewhat as the frequency of circuit operation is varied, circuitry has sometimes been required in prior oscillators to transform the impedance changes of said crystal to acceptable values, whereby oscillation can be maintained. Another disadvantage of the prior art relates to a nonlinearity of modulating circuitry resulting in distortion in the frequency modulated output signal.

It is therefore an object of the present invention to provide an improved frequency modulated crystal oscillator of economical and straightforward construction preferably employing a single active amplifying element and avoiding undue complication in regenerative feedback circuitry.

It is another object of the present invention to provide an improved frequency modulated crystal oscillator wherein problems of transformation of piezoelectric crystal impedance variation are avoided.

It is a further object of the present invention to provide a frequency modulated crystal oscillator providing a more linear, nondistorted output in response to variations in audio frequency input signal.

In accordance with an embodiment of the present invention, an active amplifying device, such as a transistor, forms the basis of the oscillator and an output terminal of this transistor is connected to an output circuit. A frequency determining input circuit is coupled to the transistor's base input terminal, this terminal having a higher input impedance than that of the emitter. The higher impedance terminal is used as will hereinafter become more evident, to allow for changes in crystal circuit impedance with audio modulation. The frequency determining input circuit of the oscillator comprises a piezoelectric crystal having an inductance coupled thereacross to eliminate the effect of parallel crystal resonance, and the crystal is further connected in series with a series resonant circuit between the aforementioned input terminal of the active amplifying device and a point of common reference potential. The last mentioned series resonant circuit includes means for varying the series resonant frequency thereof at an audio modulating frequency. Variation of the frequency of this series circuit has the effect of varying the output frequency of the oscillator.

Means for varying this resonant frequency preferably comprises a voltage-variable capacitor, e.g. a reverse biased PN junction. The latter is shunted by an inductance for the purpose of linearizing the modulating effect of this voltage-variable element. The remaining element of the series resonant circuit comprises a variable trimmer capacitor connected in series with the voltage-variable capacitor and employed for tuning or optimizing circuit operation.

The circuit according to the present invention doesn't require an interstage or interelement regenerative feedback loop circuit inasmuch as adequate regeneration takes place via the active amplifying device, nor does the present circuit require impedance transformation in the crystal circuit.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawing which is a schematic diagram of an oscillator circuit according to the present invention.

Referring to the drawing, a transistor 10, here illustrated as an NPN type, comprises the active amplifying device in the oscillator according to the present invention. An input circuit is coupled to base terminal 12 and an output circuit is coupled to a collector terminal 14, while the emitter terminal 16 is common to both the input and output circuits. The output circuit comprises the parallel combination of variable capacitor 18 in parallel with inductance 20 and this combination is tuned near the resonant frequency of the oscillator. The terminal of capacitor 18 and inductance 20 remote from collector 14 is coupled to a source of collector voltage at terminal 22, and through bypass capacitor 24 to a point of common reference potential or ground. The output, in this case, the frequency modulated output, is suitably derived from a coil 26 link coupled to inductance 20. It is thus not taken from the primary frequency determining portion of the oscillator.

Common emitter terminal 16 is coupled to a point of common reference potential or ground by way of resistor 28 in parallel with the shunt reactance of capacitor 30. The feedback leading to oscillation in the present circuit is provided between the terminals of the active amplifying device or transistor and specifically at emitter terminal 16. This feedback may be adjusted through varying the reactance of capacitor 30 at the oscillation frequency.

Base terminal 12 is connected to resistors 32 and 34 which are connected respectively to a source of positive and negative voltage for providing the proper bias for base terminal 12. Also connected to base 12 is a series input circuit for determining the frequency of oscillation of the present oscillator. This series circuit includes piezoelectric crystal, e.g., a quartz crystal 36, having an inductance 38 shunted thereacross, with one of the connections of the quartz crystal being coupled to base 12. This quartz crystal is the principal frequency determining element of the oscillator. One of the primary characteristics of such a crystal is the exhibition of both parallel and series resonant frequencies. The series resonant frequency is employed in the present circuit and therefore inductance 38 is included to insure symmetrical and linear operation of the crystal about its series resonant frequency when modulation takes place. This inductance 38 is chosen to resonate with the parallel capacitive reactance of the crystal for removing the parallel resonant frequency of the crystal to the same value as the series resonant frequency. Under these circumstances only the series resonant frequency is effective whereby the crystal exhibits a very low series resonant impedance at such frequency and substantially no parallel resonant peak.

The connection of crystal 36 remote from base 12 is coupled to a point of common reference potential or ground through a series resonant circuit including a first variable capacitor 40 in series with an inductance 42 wherein the inductance 42 is interposed between ground and the capacitor 40. This series resonant circuit also includes a varactor or voltage-variable capacitor 44 shunted across inductance 42 by way of D.C. blocking capacitor 46. This voltage-variable capacitor 44 comprises the means for varying the series resonant frequency of the aforementioned series resonant circuit and suitably consists of a reverse biased silicon PN junction diode having its anode connected to ground and its cathode connected to capacitor 46. Positive reverse bias for this element is provided from terminal 48 through resistor 50 and RF choke 52. Such a reverse biased PN junction has the property of providing a variable interelectrode capacitance as a function of voltage supplied thereacross and, therefore, this element is suitable as a modulating element for the circuit.

An audio frequency input may be applied between terminal 54, terminal 56 with the latter terminal being grounded. Terminal 56 is connected to terminal 48 by means of audio frequency bypass capacitor 58, and terminal 54 is coupled through audio coupling capacitor 60 to the junction between resistor 50 and RF choke 52. The latter junction is also bypassed to ground for radio frequencies with capacitor 62. The audio frequency input is therefore coupled across resistor 50 and in effect adds to the bias voltage from terminal 48 for the purpose of varying the capacitance of voltage-variable capacitor 44. The audio and radio frequency circuits are decoupled by the filter comprising radio frequency choke 52 and capacitor 62. The series resonant circuit is initially tuned substantially to the series resonant frequency of crystal 36, for example, with variable capacitor 40, serving as a trimmer capacitor. However, as audio frequency signals are applied between terminals 54 and 56, the varying capacitance of voltage-variable capacitor 44 causes the resonant frequency of the series resonant circuit to change as hereinafter more fully described.

The inductance 42 is chosen so the net paralleled reactance of inductance 42 and capacitor 44 is inductive. The resulting inductive reactance is resonated with capacitor 40 at the series resonant frequency of the crystal. This arrangement has considerable advantage over a voltage-variable capacitor series resonated by an inductance.

Unfortunately, the usual voltage-variable capacitor in the form of a reverse biased PN junction is quite nonlinear in its operation. The capacitance of the diode element, rather than being a linear function of the applied voltage is, instead, approximately proportional to the square root of the applied voltage. Therefore, the series resonant frequency of a circuit including such a diode becomes a non-linear function of the audio frequency input voltage resulting in distortion in the modulated output of an oscillator. However, according to the circuit of the present invention, the effect of parallel inductance 42 and the voltage-variable capacitor 44 is to render the change of the resonant frequency of the circuit a more linear function of the input voltage. In the circuit according to the present invention, if the inductive reactance of inductance 42 is made twice the reactance of voltage-variable capacitor 44, for example, then the square of the resonant frequency will vary as $$\frac{1/\sqrt{\Delta E}}{2}$$

where $\Delta E$ is the change in voltage across the voltage-variable capacitor 44.

During operation of the oscillator circuit according to the present invention, audio frequency input applied between terminals 54 and 56 frequency modulates the radio frequency output produced at coil 26. Although the frequency of oscillation of the circuit is principally determined by quartz crystal 36, the oscillating frequency of the circuit is varied in accordance with the audio frequency input information in the following manner. When the oscillator is operating at its nominal fixed frequency, e.g., the series resonant frequency of crystal 36, the voltage phase difference across crystal 36 is equal to that across the series resonant circuit comprising capacitor 40 and inductance 42 with a voltage-variable capacitor 44 connected across the latter. Now, however, if the resonant frequency of the series resonant circuit comprising elements 40, 42 and 44 is changed through the application of an audio frequency input, the voltage phase difference across this series resonant circuit would no longer be equal to that across the crystal. However, in order for the proper phase relationships in the overall circuit to exist so the circuit oscillates, these phase differences must remain substantially the same and they can be the same only at some other frequency. Therefore, the oscillation frequency of the circuit changes to such frequency at which these phase differences are once more equal to one another.

As the overall oscillating frequency of the circuit is changed to values slightly different from the initial series resonant frequency of crystal 36, the impedance of the crystal tends to change. Except for inductance 38, the change in such impedance on one side of the series resonant point would be different from change in impedance on the other side of the series resonant point, due to the presence of a separate parallel resonant frequency. The inductance 38 across crystal 36 renders the series resonance curve of the crystal symmetrical and materially enhances linear modulating action. It is also noted that since the crystal is coupled to a relatively high impedance input connection on the active amplifying device or transistor 10, e.g., the base electrode, the inductance 38 can be simply coupled across crystal 36 without requiring a separate impedance transforming winding or tap thereon. Since the impedance of crystal 36 tends to change somewhat with frequency, there has been a tendency in some circuits for the impedance thereof to reach a value wherein efficient oscillation is not possible and the circuit would cease to operate. Therefore, it has heretofore been the practice, when varying the oscillation frequency of the crystal, to provide coupling means for decreasing this change in impedance as seen by the remainder of the circuit. One method of accomplishing this result was to include a transformer winding in the circuit with a crystal connected to a separate winding of the transformer to achieve the impedance transformation. Such an impedance transformer arrangement can be expensive and, moreover, the transformation has a deleterious effect on the Q of the circuit and, therefore, circuit stability since Q is "transformed" down by the turns ratio. However, in the present circuit, transformation is avoided because the crystal circuit is coupled to a circuit point more compatible with the higher crystal impedances.

By way of summary, the circuit according to the present invention is simpler than prior suggested circuits in that no complicated regenerative loop is required, but rather such feedback as is necessary takes place in the amplifying element itself and in its common emitter circuit. Moreover, since no crystal impedance coupling devices are required, the circuit according to the present invention is economical to construct and requires few adjustments. As an important additional feature of the present invention, frequency modulation operation is linearized by shunting a voltage-variable capacitor with an inductance whereby to decrease the non-linear effect of such voltage-variable capacitor. Furthermore, an additional adjustable or trimmer capacitor is provided in the series resonant circuit and this additional capacitor can be used to provide such adjustment as may be required to tune and optimize operation of the present circuit.

In the claims appended to the present application, the input or control terminal of the active amplifying device having a higher input impedance than a common terminal, refers to the base input connection of a transistor or the like as opposed to a lower impedance emitter input connection. The common terminal coupled to a point of common reference potential refers, for example, to the common emitter. The output terminal, e.g., the collector, is coupled to the output circuit of the oscillator from which the frequency modulated output is derived. Thus, the frequency modulated output is not taken from the input or frequency determining circuit of the oscillator.

While I have shown and described a particular embodiment of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A frequency modulated oscillator comprising:

an input circuit, an output circuit, and a point of common reference potential, a single active amplifying device including an output terminal coupled to said output circuit, a control terminal connected to said input circuit, and a common terminal coupled to said point of common reference potential, said control terminal having a higher input impedance than said common terminal, said amplifying device providing the only coupling between said input and said output circuits at the operating frequency of the oscillator, said input circuit comprising the series combination of a quartz crystal and a series resonant circuit substantially resonant at the series resonant frequency of said quartz crystal, and inductive means coupled across said quartz crystal for resonating the parallel capacitance of said quartz crystal to bring the parallel resonant frequency of said crystal approximately to the frequency of series resonance of said crystal, said series resonant circuit comprising a first capacitor in series with a parallel combination of an inductance and an independently variable capacitor adapted for changing its capacitance in response to a modulating signal, said last mentioned inductance having a greater reactive effect than said variable capacitor in said parallel combination to result in a net inductive reactance in said series resonant circuit for resonating with said first capacitor such that the effect of the independently variable capacitor on the resonant frequency of said series resonant circuit is linearized by said last mentioned inductance, and means for providing a modulating signal to said independently variable capacitor.

2. The oscillator according to claim 1 wherein said independently variable capacitor comprises a PN junction, with means for back biasing said PN junction.

3. The oscillator according to claim 1 wherein said active amplifying device comprises a transistor having its base terminal coupled to said input circuit, having its collector terminal coupled to said output circuit, and having its emitter terminal coupled to said point of common reference potential.

4. The oscillator according to claim 2 wherein one terminal of said quartz crystal is connected to said amplifying device's control terminal, and wherein said first capacitor is coupled to the terminal of said quartz crystal remote from said control terminal, said parallel combination being interposed between the remaining terminal of said first capacitor and said point of common reference potential, said circuit further including a blocking capacitor between said first capacitor and said independently variable capacitor, said means for providing a modulating signal to said independently variable capacitor including an RF choke for coupling the junction of said blocking capacitor and said independently variable capacitor to a source of modulating signal voltage.

5. The oscillator according to claim 1 wherein said first capacitor comprises a variable trimmer capacitor for adjusting the optimum center resonant frequency of said series resonant circuit.

References Cited

UNITED STATES PATENTS

| | | | |
|---|---|---|---|
| 2,925,561 | 2/1960 | MacDonald | 332—26 |
| 2,925,562 | 2/1960 | Firestone | 332—26 |
| 3,007,118 | 10/1961 | Steel | 331—164 |
| 3,068,427 | 12/1962 | Weinberg | 331—158 |

FOREIGN PATENTS

| | | |
|---|---|---|
| 926,876 | 5/1963 | Great Britain. |

JOHN KOMINSKI, *Primary Examiner.*